United States Patent [19]
Yokoyama

[11] Patent Number: 6,049,091
[45] Date of Patent: Apr. 11, 2000

[54] HIGH ELECTRON MOBILITY TRANSISTOR

[75] Inventor: Takashi Yokoyama, Tokyo, Japan

[73] Assignee: NEC Corporation, Japan

[21] Appl. No.: 08/885,744

[22] Filed: Jun. 30, 1997

[30] Foreign Application Priority Data

Jul. 1, 1996 [JP] Japan .................................. 8-170998

[51] Int. Cl.$^7$ ................................................ H01L 31/072
[52] U.S. Cl. ............................... 257/52; 257/57; 257/66; 257/192; 257/194; 438/482
[58] Field of Search ................................... 257/192, 194, 257/57, 66, 52; 438/482

[56] References Cited

U.S. PATENT DOCUMENTS

| 4,741,964 | 5/1988 | Haller ....................................... 428/446 |
| 5,272,361 | 12/1993 | Yamazaki .................................. 257/66 |
| 5,365,080 | 11/1994 | Yamazaki .................................. 257/66 |
| 5,696,387 | 12/1997 | Choi et al. ................................ 257/57 |
| 5,834,796 | 11/1998 | Matsuda et al. ........................... 257/57 |
| 5,864,150 | 1/1999 | Lin ........................................... 257/61 |

FOREIGN PATENT DOCUMENTS 62-86867   4/1987   Japan .

OTHER PUBLICATIONS

Mimura et al; "A New Field–Effect Transistor with Slectively Doped GaAs/n–Al$_x$Ga$_{1-x}$As Heterojunctions"; May 1980; pp. 225–227; Japanes Journal of Applied Physics, vol. 19, No. 5.

People et al; "Modulation doping in Ge$_x$ Si$_{1-x}$/Si strained layer heterostructures"; Dec. 1, 1984; pp. 1231–1233; Appl. Physics Letters, vol. 45, No. 11

Primary Examiner—William Mintel
Attorney, Agent, or Firm—Hayes, Soloway, Hennessey, Grossman & Hage, P.C.

[57] ABSTRACT

There is provided a field effect transistor including (a) an amorphous semiconductor layer made of amorphous silicon hydride containing impurities doped therein, (b) a semiconductor layer made of single crystal silicon having an electron affinity greater than that of the amorphous silicon hydride, formed on the amorphous semiconductor layer, (c) a gate insulating film formed on the semiconductor layer, and (d) a gate electrode formed on the gate insulating film. The amorphous semiconductor layer and the semiconductor layer cooperate with each other to thereby form a potential well at a junction therebetween. The above mentioned field effect transistor utilizes a difference in electron affinity between the amorphous semiconductor layer and the semiconductor layer to thereby make it possible to operate at a higher speed because carriers are not influenced by scattering of doped ions. In addition, the formation of a single crystal silicon layer on an amorphous silicon layer, which would be difficult to fabricate by epitaxial growth, can be accomplished by means of ion implantation, and can be operated in accordance with the operation principle of a conventional MOS transistor.

23 Claims, 6 Drawing Sheets

HIGH ELECTRON MOBILITY TRANSISTOR

BACKGROUND OF THE INVENTION

1. Field of the Invention

The invention relates to an integrated circuit constituted of semiconductor devices for operation and storage which are widely utilized in electronic devices such as computer and communication devices. More particularly, the invention relates to a high electron mobility transistor (HEMT) using two-dimensional electron gas or two-dimensional hole gas as carriers.

2. Description of the Related Art

There are many methods of enhancing mobility of carriers in a semiconductor device. As one of such methods, there has been suggested an HEMT in Japanese Journal of Applied Physics, Vol. 19, No. 5, 1980, pp. L225–L227. The suggested HEMT is made of compound semiconductor such as GaAs, and utilizes a quantum well or potential well as a channel of a transistor. Such a quantum or potential well is formed by band off-set caused by joining two semiconductors having different electron affinity to each other. With regard to silicon which is mainly used to make memory and logic transistors thereof, there has been suggested an HEMT made of a Si/SiGe family utilizing material a difference in electron affinity therebetween (Applied Physics Letters, Vol. 45, No. 11, 1984, pp. 1231–1233).

However, it is quite difficult to form qualified hetereojunctions because of a difference in lattice constant between Ge and Si. Thus, Japanese Unexamined Patent Publication No. 62-86867 has suggested a HEMT made of a silicon family material, including a semiconductor layer 40 made of crystal silicon, an amorphous SiC layer 41 having smaller electron affinity than that of the crystal silicon layer 40, and a gate electrode 42 formed on the amorphous SiC layer 41. The suggested HEMT utilizes an interface between the amorphous SiC layer 41 and the crystal silicon layer 40 to thereby accomplish higher mobility in a transistor.

However, the above mentioned conventional HEMT has problems as follows.

The first problem is that even if impurities were doped into the amorphous SiC layer as a carrier supply, it would be impossible to have a desired carrier concentration. This is because that since SiC is in amorphous condition and hence there are a lot of dangling bonds in the amorphous SiC layer 41, electrons or holes as carriers are trapped with such dangling bonds.

The second problem is that it is quite difficult to have a qualified interface between a crystal silicon layer and an amorphous SiC layer. The reason is as follows. When an amorphous SiC layer is made to grow by means of chemical vapor deposition (CVD) or molecular beam epitaxy (MBE), the amorphous SiC layer is influenced by the underlying silicon layer at an initial stage in growth, and thus grains tend to be formed at an interface between the crystal silicon layer and the amorphous SiC layer. Thus, the interface that is intended to be used as a channel becomes irregular, which does not ensure normal transistor operation.

The third problem is that there would be caused a risk of an increase in fabrication costs. The reason is that it would be necessary to prepare an apparatus for carrying out CVD used only for growth of SiC.

SUMMARY OF THE INVENTION

It is an object of the present invention to provide a field effect transistor and a method of fabricating the same both of which are capable of decreasing defects at an interface between an amorphous silicon layer and a crystal silicon layer, and increasing concentration of carriers in the silicon substrate.

In one aspect, there is provided a field effect transistor including (a) a first semiconductor layer made of amorphous silicon hydride, and (b) a second semiconductor layer made of single crystal silicon having an electron affinity greater than that of the amorphous silicon hydride, in which the first and second semiconductor layers cooperate with each other to form at a junction therebetween a potential well which forms a channel in which carriers transfer.

It is preferable that the first semiconductor layer is a layer containing impurities such as hydrogen doped therein. The potential well may form a channel for one of two-dimensional electron gas and two-dimensional source gas to transfer therethrough. It is preferable that the second semiconductor layer contains an epitaxial silicon layer made of an intrinsic semiconductor.

There is further provided a field effect transistor including (a) an amorphous semiconductor layer made of amorphous silicon hydride containing impurities doped therein, (b) a semiconductor layer made of single crystal silicon having an electron affinity greater than that of the amorphous silicon hydride, formed on the amorphous semiconductor layer, (c) a gate insulating film formed on the semiconductor layer, and (d) a gate electrode formed on the gate insulating film. The amorphous semiconductor layer and the semiconductor layer cooperate with each other to thereby form a potential well at a junction therebetween.

There is still further provided a field effect transistor including (a) a first semiconductor layer made of single crystal silicon, (b) a second semiconductor layer made of amorphous silicon hydride containing impurities doped therein and having an electron affinity smaller than that of the single crystal silicon, (c) a gate insulating film formed on the second semiconductor layer, and (d) a gate electrode formed on the gate insulating film. The first and second semiconductor layers cooperate with each other to form a potential well at a junction therebetween.

There is yet further provided a field effect transistor including (a) a semiconductor substrate having a first electrical conductivity, (b) an amorphous semiconductor layer formed in the semiconductor substrate and made of amorphous silicon hydride in which impurities having a second electrical conductivity are doped, (c) source and drain regions formed on the amorphous semiconductor layer, the source and drain regions having a second electrical conductivity, (d) a semiconductor layer made of single crystal silicon and sandwiched between the source and drain regions on the amorphous semiconductor layer, the single crystal silicon having an electron affinity greater than that of the amorphous silicon hydride, (e) a gate insulating film formed on the source and drain regions and the semiconductor layer, and (f) a gate electrode formed on the gate insulating film. The amorphous semiconductor layer and the semiconductor layer cooperate to each other to form a potential well at a junction therebetween which well contains carriers having a second electrical conductivity.

It is preferable for the semiconductor layer to have a first portion sandwiched between the source and drain regions on the amorphous semiconductor layer, and a second portion covering the first portion and the source and drain regions therewith, the gate insulating film being formed on the second portion. It is preferable that the second portion has higher purity than that of the first portion.

The above mentioned field effect transistor may further include a nitride film formed over the gate insulating film. The field effect transistor may further include an interlayer insulating film over the gate electrode and the gate insulating film, hydrogen contained in the interlayer insulating film being diffused into an amorphous semiconductor layer formed in the semiconductor substrate to thereby form the amorphous semiconductor layer made of amorphous silicon hydride in which impurities having a second electrical conductivity are doped. The field effect transistor may further include a second amorphous semiconductor layer formed below the amorphous semiconductor layer. The field effect transistor may further include an oxide layer formed below the amorphous semiconductor layer.

There is still yet further provided a field effect transistor including (a) a silicon substrate having a first electrical conductivity, (b) source and drain regions having a second electrical conductivity, formed in the silicon substrate, (c) a semiconductor layer made of single crystal silicon and sandwiched between the source and drain regions, (d) an amorphous semiconductor layer formed on the source and drain regions and the semiconductor layer, and made of amorphous silicon hydride containing impurities having a second electrical conductivity doped therein, the amorphous semiconductor layer having an electron affinity smaller than that of the single crystal silicon, the amorphous semiconductor layer and the semiconductor layer cooperating with each other to form a potential well containing carriers having a second electrical conductivity, (e) a gate insulating film formed on the amorphous semiconductor layer, and (f) a gate electrode formed on the gate insulating film.

There is further provided a field effect transistor including (a) a silicon substrate having a first electrical conductivity, (b) an amorphous semiconductor layer made of amorphous silicon hydride containing impurities having a second electrical conductivity doped therein, and formed in the silicon substrate, (c) source and drain regions having a second electrical conductivity, formed on the amorphous semiconductor layer, (d) a semiconductor layer made of single crystal silicon and sandwiched between the source and drain regions on the amorphous semiconductor layer, the semiconductor layer having a smaller thickness than those of the source and drain regions, (e) an epitaxial silicon layer made of intrinsic semiconductor and formed over the semiconductor layer, both of the semiconductor layer and the epitaxial silicon layer having an electron affinity greater than that of the amorphous silicon nitride, (f) a gate insulating film formed on the epitaxial silicon layer, and (g) a gate electrode formed on the gate insulating film. The amorphous semiconductor layer and the semiconductor layer cooperate with each other to form a potential well at a junction therebetween, which well contains carriers having a second electrical conductivity.

In another aspect, there is provided a method of fabricating a field effect transistor, including the steps of (a) forming an amorphous silicon layer having a second electrical conductivity in a substrate made of single crystal silicon having a first electrical conductivity so that a single crystal silicon layer exists on the amorphous silicon layer, (b) turning the amorphous silicon layer into an amorphous silicon hydride layer having a second electrical conductivity, the amorphous silicon hydride layer and the single crystal layer cooperating with each other to form a potential well at a junction therebetween in which well carriers transfer, (c) forming a gate insulating film on the substrate, and (d) forming a gate electrode on the gate insulating film.

For instance, the step (b) may be carried out by ion-implanting hydrogen into the amorphous silicon layer, or by diffusing hydrogen into the amorphous silicon layer from an insulating film containing hydrogen therein and formed above the amorphous silicon layer. The above mentioned method may further include the step of forming source and drain regions having a second electrical conductivity so that the single crystal silicon layer is sandwiched between the source and drain regions. The method may further include the steps (e) of ion-implanting the substrate with at least one of oxygen, nitrogen and carbon to thereby form a first amorphous silicon layer, and (f) ion-implanting the first amorphous silicon layer with impurities having a second electrical conductivity to turn at least a part of the first amorphous silicon layer into the amorphous silicon hydride layer having a second electrical conductivity. The steps (e) and (f) are carried out in place of the step (b).

There is further provided a method of fabricating a field effect transistor, including the steps of (a) forming an amorphous silicon layer having a second electrical conductivity at a surface of a substrate made of single crystal silicon having a first electrical conductivity, (b) turning the amorphous silicon layer into an amorphous silicon hydride layer having a second electrical conductivity, the amorphous silicon hydride layer and a single crystal layer located therebelow cooperating with each other to form a potential well at a junction therebetween in which well carriers transfer, (c) forming a gate insulating film on the amorphous silicon hydride layer, and (d) forming a gate electrode on the gate insulating film.

The method may further include the step of forming source and drain regions having a second electrical conductivity under the amorphous silicon layer.

There is still further provided a method of fabricating a field effect transistor, including the steps of (a) forming source and drain regions having a second electrical conductivity at a surface of a substrate made of single crystal silicon having a first electrical conductivity so that a single crystal silicon layer exists between the drain and source regions, (b) ion-implanting impurities having a second electrical conductivity into the substrate at a predetermined depth to thereby form an amorphous silicon layer having a second electrical conductivity so that the amorphous silicon layer is situated under the source and drain regions and the single crystal silicon layer, (c) turning the amorphous silicon layer into an amorphous silicon hydride layer having a second electrical conductivity, (d) etching the single crystal silicon layer to thereby make the single crystal silicon layer thinner, (e) forming an epitaxial silicon layer of intrinsic semiconductor on the thus etched single crystal silicon layer, (f) forming a gate insulating film on the epitaxial silicon layer, and (g) forming a gate electrode on the gate insulating film. The amorphous silicon hydride layer and the single crystal layer cooperate with each other to form a potential well in the vicinity of a junction therebetween which well acts as a channel in which two-dimensional carrier gas transfers.

It is preferable that the etched single crystal silicon layer has a thickness of about 6 nm. It is also preferable that the epitaxial silicon layer has a thickness in the range of 50 to 100 nm both inclusive.

FIG. 4 illustrates a basic structure of a field effect transistor (FET) in accordance with the present invention. The illustrated FET is characterized in that the band off-set between an amorphous silicon hydride layer 32 containing impurities doped therein and a single crystal silicon layer 12 forms a quantum well 8 at an interface the layers 32 and 12 as illustrated in FIG. 6-A. Herein, the single crystal silicon layer 12 has an electron affinity greater than that of the amorphous silicon hydride layer 32. Specifically, the amorphous silicon hydride layer 32 has an electron affinity of 3.81 eV, whereas the single crystal silicon layer 12 has an electron affinity of 4.01 eV. In the quantum well 8, there is formed two-dimensional electron gas (hereinafter, referred to simply as "2DEG") 9 to which doped ions are supplied from the amorphous silicon hydride layer 32 to which impurities are doped. By using the quantum well 8 as a channel of a transistor, since the 2DEG carriers are located in a different region from a region where the doped ions are located (namely, modulation doping), it is possible for the 2DEG carriers to avoid being scattered due to impurities, and significantly enhance mobility of the carriers.

Hereinbelow is explained a method of fabricating the above mentioned basic FET structure. The method is characterized by that a single crystal silicon-on amorphous silicon hydride junction structure is formed by ion-implanting n-type impurities through a single crystal silicon to thereby form an impurities-doped amorphous silicon layer 31 (see FIG. 3B) under the single crystal silicon layer 12. Herein, the n-type impurities supply 2DEG. This method makes it possible to have a single crystal silicon-on amorphous silicon hydride junction structure in which a single crystal silicon layer is formed on an amorphous silicon layer and which has a qualified interface therebetween that would be difficult to form by methods such as CVD and MBE. Then, hydrogen is introduced into the thus formed amorphous silicon layer, followed by low temperature heating to thereby turn the impurities-doped amorphous silicon layer 31 into an impurities-doped amorphous silicon hydride layer 32. Thus, it is possible to have a qualified interface between a single crystal silicon layer and an amorphous silicon layer by ion-implantation, and it is also possible to significantly decrease dangling bonds in the amorphous silicon layer by introducing hydrogen thereinto.

Then, the impurities-doped amorphous silicon hydride layer 32 is grown until a single crystal silicon layer 12 existing on the layer 32 has a thickness of a couple of atomic layers or a couple of nanometers. Then, a highly purified single crystal layer 5, or an intrinsic semiconductor layer is formed on the single crystal silicon layer 12 by UHV-CVD. The energy peak of a wave function of two-dimensional electron gas as illustrated in FIG. 6-A, extends into the single crystal layer 12, as illustrated in FIG. 6-B. Thus, if the energy peak is designed to extend into the highly purified single crystal layer 5, it would be possible to use the highly purified single crystal silicon layer 5 as a main channel region in place of the underlying single crystal layer 12 which is considered to be adversely affected by the ion-implantation, namely defects are generated therein and impurities are diffused therein. Thus, the mobility of carriers gets closer to an ideal condition.

If the highly purified single crystal silicon layer 5 is deposited thick, specifically, at a thickness in the range of about 50 to about 100 nm, there could be obtained delta-doping where impurities are distributed like a delta function in a depth-wise direction from a gate oxide film. This ensures that the hot carrier effect, which would be a problem in a lightly doped drain (LDD) where a drain diffusion layer is formed shallow, when a gate length of a transistor is made smaller, could be significantly reduced, and hence it would be possible to prevent deterioration of an oxide film.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
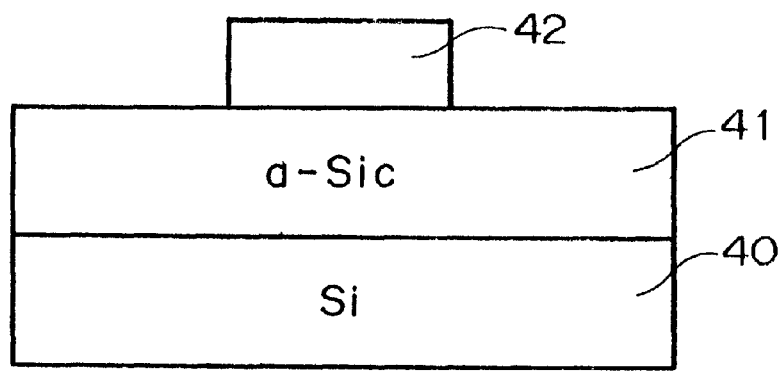
FIG. 1 is a cross-sectional view of a conventional field effect transistor.
Figure 2:
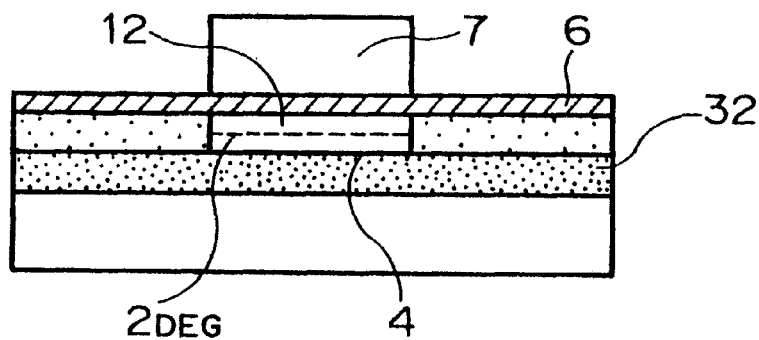
FIG. 2 is a cross-sectional view of a field effect transistor in accordance with the first embodiment of the present invention.

FIG. 2 illustrates a field effect transistor (FET) in accordance with the first embodiment. In the instant embodiment, the invention is applied to an n-type MOSFET.

The illustrated n-type MOSFET includes a $P^-$ type substrate 1 made of single crystal silicon, an impurities-doped amorphous silicon hydride layer 32 formed in the silicon substrate 1 at a certain depth, $N^+$ source and drain regions 21 and 22 formed on the amorphous silicon hydride layer 32, a single crystal silicon layer 12 sandwiched between the source and drain regions 21 on the amorphous silicon hydride layer 32, a gate insulating film 6 formed on the source and drain regions 21 and 22 and the single crystal silicon layer 12, and a gate electrode 7 formed on the gate insulating film 6 above the single crystal silicon layer 12. The single crystal silicon layer 12 has an electron affinity greater than that of the amorphous silicon hydride layer 32. The amorphous silicon hydride layer 32 and the single crystal silicon layer 12 cooperate with each other to thereby form a potential well 8 (see FIG. 6-A) at a junction therebetween. The potential well 8 contains N-type carriers.

Figure 3A:
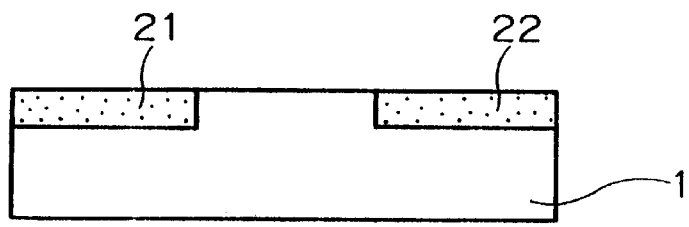
FIGS. 3A to 3C are cross-sectional views of a field effect transistor illustrated in FIG. 2, illustrating respective steps of a method of fabricating the same.

A method of fabricating the FET illustrated in FIG. 2 is explained hereinbelow with reference to FIGS. 3A to 3C. First, as illustrated in FIG. 3A, there are formed $N^+$ regions 21 and 22 at a surface of the $P^-$ type single crystal silicon substrate 1 by ion-implantation. The regions 21 and 22 act as source and drain.

Figure 3B:
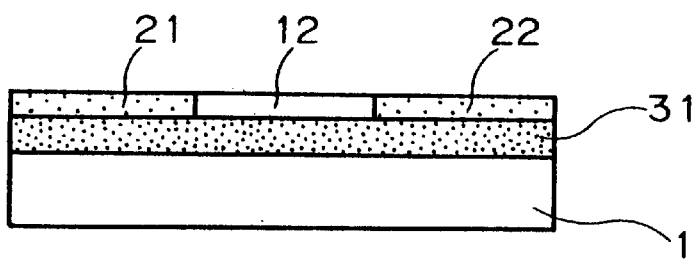

Then, as illustrated in FIG. 3B, a dopant such as arsenic (As), antimony (Sb) or phosphorus (P) is ion-implanted into the silicon substrate 1 through the source and drain regions 21 and 22 to thereby form an impurities-doped amorphous silicon layer 31 immediately below the source and drain regions 21 and 22. The impurities-doped amorphous silicon layer 31 is designed to have a thickness in the range of 10 nm to 100 nm both inclusive. By forming the impurities-doped amorphous silicon layer 31, a portion 12 sandwiched between the source and drain regions 21 and 22 is separated from the silicon substrate 1. For instance, when arsenic (As) is used as a dopant, the silicon substrate 1 is implanted at 50 to 100 KeV with doses of $1 \times 10^{18}$ As $cm^{-2}$.

Then, the silicon substrate 1 is implanted at 5 to 10 KeV with doses of $1 \times 10^{18}$ H $cm^{-2}$, which joins dangling bonds in the amorphous silicon layer 31 to hydrogen to thereby turn the amorphous silicon layer 31 into an amorphous silicon hydride layer 32. Hydrogen implanted into the amorphous silicon layer 31 significantly reduces the number of dangling bonds existing in the vicinity of an interface 4 between the single crystal silicon layer 12 and the amorphous silicon hydride layer 32. Thus, a qualified interface between a single crystal layer and an amorphous silicon hydride layer can be obtained.

Figure 3C:
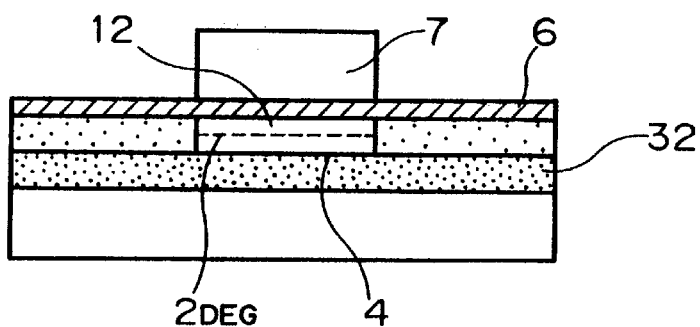

Then, as illustrated in FIG. 3C, a gate oxide film 6 is formed covering the source and drains 21 and 22, and the upper single crystal layer 12 by low temperature plasma oxidation. Then, a gate electrode 7 is formed on the gate insulating film 6. Thus, there is completed the FET illustrated in FIG. 2.

Figure 4:
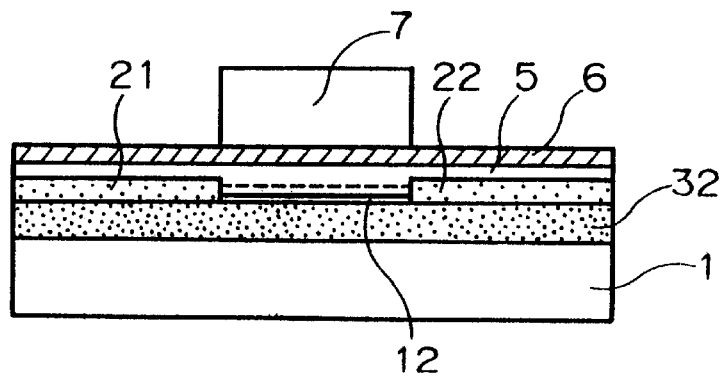
FIG. 4 is a cross-sectional view of a field effect transistor in accordance with the second embodiment of the present invention.

FIG. 4 illustrates a field effect transistor in accordance with the second embodiment. In the instant embodiment, the invention is applied to high electron mobility transistor (HEMT) having a highly purified crystal silicon layer formed prior to the formation of an oxide film.

The illustrated HEMT includes a P<sup>-</sup> type substrate 1 made of single crystal silicon, an impurities-doped amorphous silicon hydride layer 32 formed in the silicon substrate 1 at a certain depth, N<sup>+</sup> source and drain regions 21 and 22 formed on the amorphous silicon hydride layer 32, a single crystal silicon layer 12 sandwiched between the source and drain regions 21 and 22 on the amorphous silicon hydride layer 32, and having a thickness smaller than those of the source and drain regions 21 and 22, a highly purified single crystal silicon layer 5 covering the single crystal silicon layer 12 and the source and drain regions 21 and 22 therewith, a gate insulating film 6 formed on the highly purified single crystal silicon layer 5, and a gate electrode 7 formed on the gate insulating film 6 above the single crystal silicon layer 12. The single crystal silicon layer 12 has an electron affinity greater than that of the amorphous silicon hydride layer 32. The amorphous silicon hydride layer 32 and the single crystal silicon layer 12 cooperate with each other to thereby form a potential well 8 at a junction therebetween. The potential well 8 contains N-type carriers.

Figure 5A:
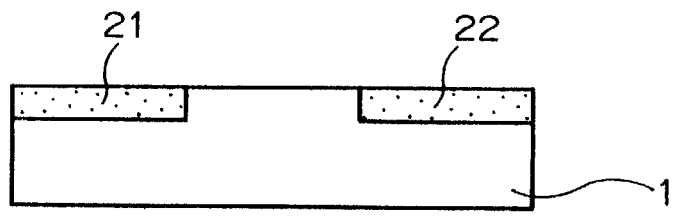
FIGS. 5A to 5E are cross-sectional views of a field effect transistor illustrated in FIG. 4, illustrating respective steps of a method of fabricating the same.

A method of fabricating the HEMT illustrated in FIG. 4 is explained hereinbelow with reference to FIGS. 5A to 5E. First, as illustrated in FIG. 5A, there are formed N<sup>+</sup> source and drain regions 21 and 22 at a surface of a P<sup>-</sup> type single crystal silicon substrate 1 by ion-implantation.

Figure 5B:
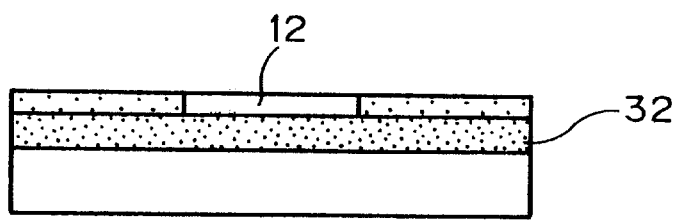

Then, a dopant such as arsenic (As), antimony (Sb) or phosphorus (P) is ion-implanted into the silicon substrate 1 through the source and drain regions 21 and 22 to thereby form an impurities-doped amorphous silicon layer immediately below the source and drain regions 21 and 22. By forming the impurities-doped amorphous silicon layer, a portion 12 sandwiched between the source and drain regions 21 and 22 is separated from the silicon substrate 1. For instance, when arsenic (As) is used as a dopant, the silicon substrate 1 is implanted at 50 to 100 KeV with doses of $1 \times 10^{18}$ As $cm^{-2}$. Then, the silicon substrate 1 is implanted at 5 to 10 KeV with doses of $1 \times 10^{18}$ H $cm^{-2}$, which joins dangling bonds in the amorphous silicon layer to hydrogen to thereby turn the amorphous silicon layer into an amorphous silicon hydride layer 32, as illustrated in FIG. 5B. At this stage, the single crystal silicon layer 12 has a thickness in the range of about 10 to about 15 nm.

Figure 5C:
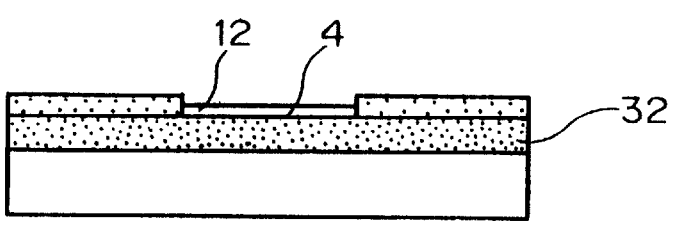

Then, as illustrated in FIG. 5C, the single crystal silicon layer 12 is etched so that a portion which will act as a channel of FET has a thickness of a couple of nanometers.

Figure 5D:
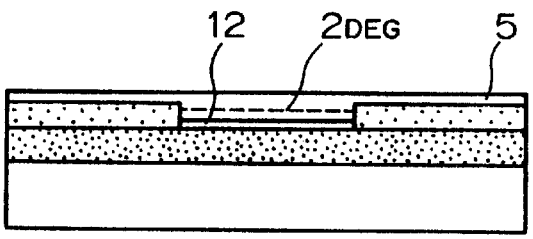

Then, as illustrated in FIG. 5D, there is formed a highly purified single crystal silicon layer 5 covering the source and drain regions 21 and 22 and the single crystal silicon layer 12 at 400° C. by epitaxial growth, employing ultra-high vacuum chemical vapor deposition (UHV-CVD) at $1 \times 10^{-7}$ Pa. The highly purified single crystal silicon layer 5 is made of intrinsic semiconductor containing significantly reduced amount of impurities doped therein. In order to keep the layer 32 in amorphous condition, it is necessary to take a process to be carried out at a temperature as low as possible. Hence, the highly purified single crystal silicon layer 5 may be formed by epitaxial growth at about 200° C., employing optical CVD.

Figure 5E:
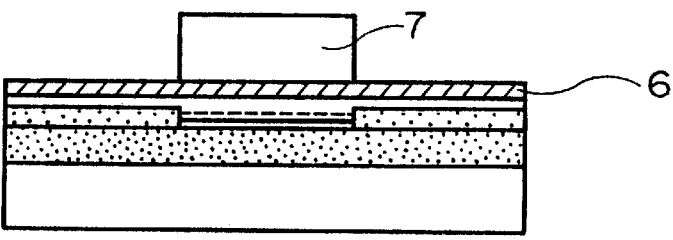

Then, as illustrated in FIG. 5E, a gate oxide film 6 is formed covering the highly purified single crystal silicon layer 5 by low temperature plasma oxidation. Then, a gate electrode 7 is formed on the gate insulating film 6 above the single crystal silicon layer 12. Thus, there is completed the FET illustrated in FIG. 4.

Figure 6:
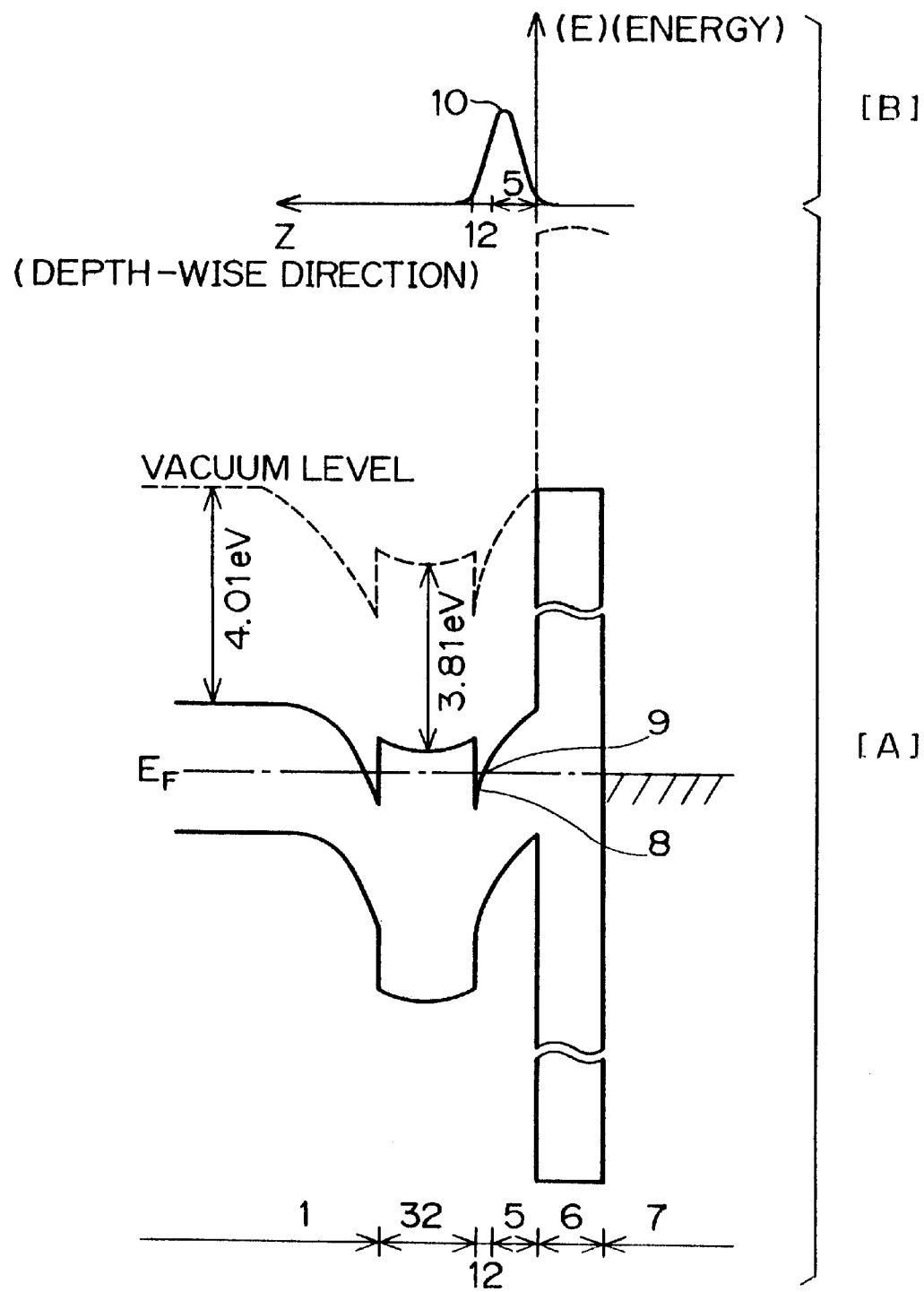
FIG. 6 is a schematic view illustrating a profile of a wave function.

FIG. 6 is a band diagram of an HEMT in accordance with the above mentioned second embodiment, and illustrates the band obtained with the highly purified single crystal silicon layer 5 illustrated in FIG. 5D. As mentioned earlier, single crystal silicon has an electron affinity of 4.01 eV, whereas amorphous silicon hydride has an electron affinity of 3.81 eV. Accordingly, if the impurities-doped amorphous silicon hydride layer 32 is made to junction with the single crystal silicon layer 12, there would be formed a potential well or a quantum well 8 in the single crystal silicon layer 12 by virtue of the band off-set effect. The impurities doped into the amorphous silicon hydride layer 32 supply electrons to the quantum well 8, and thus electrons are stored in the quantum well with the result of the formation of two-dimensional electron gas (2DEG) 9. Thus, there is accomplished so-called modulation doping where doped impurities are located in a region different from a region in which electrons as carriers are located, which ensures that scattering of ionized impurities does not adversely influence transfer of electrons in a channel. Hence, it is possible to significantly enhance the mobility of carriers. The mobility of carriers is enhanced in particular at a very low temperature.

The wave function Φ 10 of electrons existing in the quantum well 8 extends into the single crystal silicon layer 12, and has a peak at a distance of about 30 to about 50 angstroms towards the single crystal silicon layer 12 from an interface between the impurities-doped amorphous silicon hydride layer 32 and the single crystal silicon layer 12. As illustrated in FIG. 6-B, the peak is in the highly purified single crystal silicon layer 5 formed by growth in ultra-high vacuum, and hence a portion of the single crystal silicon layer 12 having a very small amount of impurities and the quite small number of defects becomes a channel for carriers to transfer therethrough.

The single crystal silicon layer 12 which might have some crystal defects caused by ion-implantation is not used as a channel, and hence electrons can move with ideal mobility. In addition, if the highly purified single crystal silicon layer 5 is formed to have a thickness in the range of about 50 to about 100 nm, a concentration of impurities in the source and drain regions 21 and 22 is distributed like a delta function in a depth-wise direction thereof. This ensures that the hot carrier effect, that is, a risk of breakdown of a gate oxide film caused by hot carriers, which would be a problem in a lightly doped drain (LDD) type diffusion layer, can be reduced.

Figure 7A:
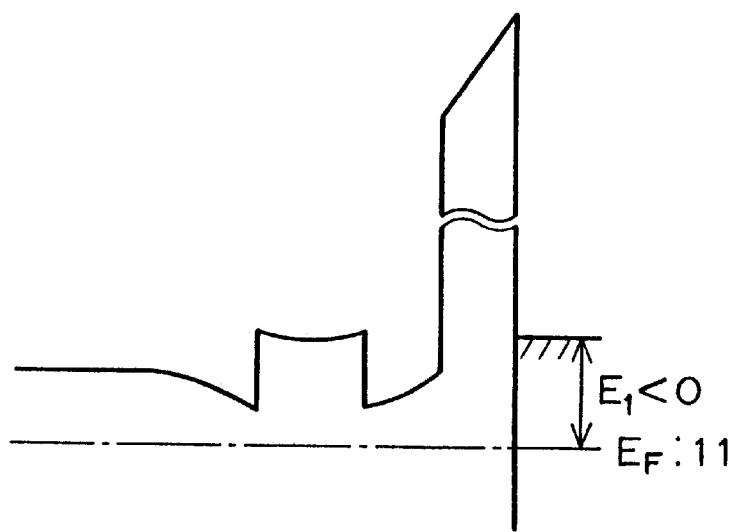
FIGS. 7A and 7B illustrate a positional relation between a quantum well and Fermi level.
Figure 7B:
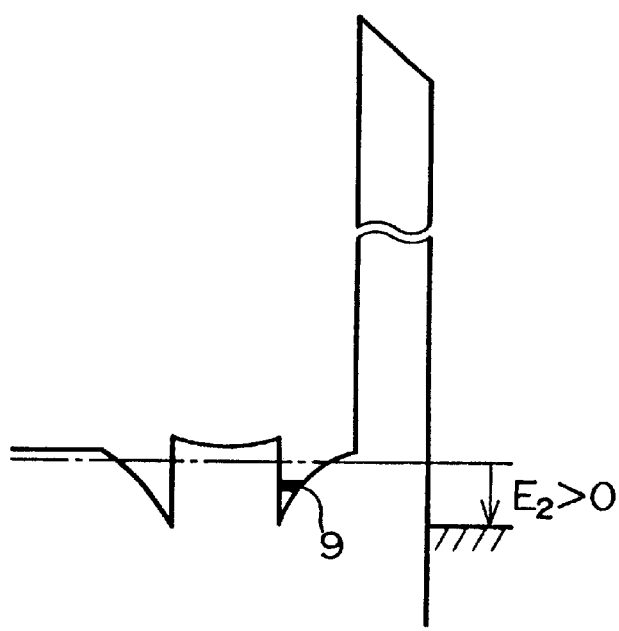

Hereinbelow is explained a principle of operation of an HEMT illustrated in FIG. 4. As an example, an enhancement type HEMT is explained. FIG. 7A is a band diagram obtained when a negative gate voltage E1 is applied to an HEMT. Since the gate electrode 7 is under a negative voltage, the quantum well 8 is located above Fermi level 11, resulting in that a channel for electrons is not formed. On the other hand, as illustrated in FIG. 7B, if a positive voltage is applied to the gate electrode 7, the quantum well 8 is located below Fermi level 11, resulting in the formation of a channel for electrons. As mentioned above, it is possible to operate an HEMT in the same way as a conventional silicon MOS transistor by controlling gate voltage.

Figure 8A:
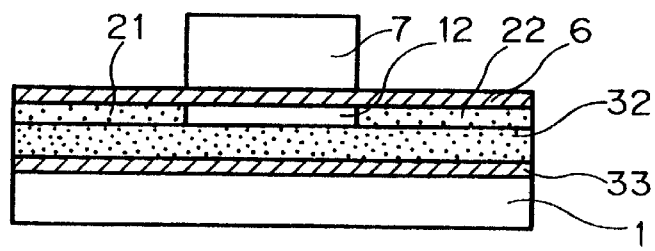
FIG. 8A is a cross-sectional view of a field effect transistor in accordance with the third embodiment of the present invention.

FIG. 8A illustrates a field effect transistor in accordance with the third embodiment. The illustrated FET includes a silicon substrate 1, an amorphous silicon layer 33 formed in the silicon substrate 1, an impurities-doped amorphous silicon hydride layer 32 formed on the amorphous silicon layer 33, source and drain regions 21 and 22 formed on the amorphous silicon hydride layer 32, a single crystal silicon layer 12 sandwiched between the source and drain 21 and 22 on the amorphous silicon hydride layer 32, a gate insulating film 6 formed over the source and drain regions 21 and 22 and the single crystal silicon layer 12, and a gate electrode 7 formed on the gate insulating film 6. The amorphous silicon hydride layer 32 and the single crystal silicon layer 12 cooperate with each other to form a potential well at a junction therebetween.

In the instant embodiment, the amorphous silicon layer 33 is first formed by implanting oxygen or nitrogen into the silicon substrate 1 prior to the formation of the impurities-doped amorphous silicon hydride layer 32 by impurities ion-implanting. By forming the amorphous silicon layer 33 in advance, it is possible to prevent ion channeling of dopant, resulting in that it is also possible to control thickness or depth of the impurities-doped amorphous silicon hydride layer 32.

Figure 8B:
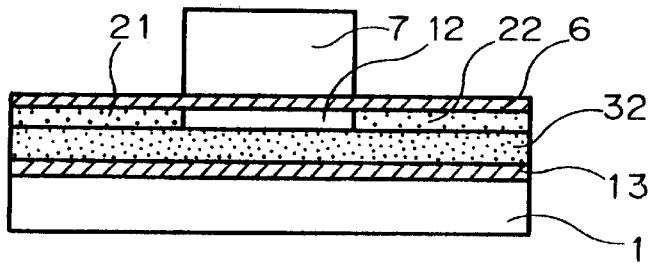
FIG. 8B is a cross-sectional view of a field effect transistor in accordance with the fourth embodiment of the present invention.

FIG. 8B illustrates a field effect transistor in accordance with the fourth embodiment. The illustrated FET has the same structure as the FET illustrated in FIG. 8A except that the illustrated FET includes an oxide layer 13 in place of the amorphous silicon layer 33. When the amorphous silicon layer 33 is turned to be amorphous by implanting oxygen thereinto, it would be possible to form an SOI (silicon on insulator) structure by applying thermal treatment to the amorphous silicon layer 33 for oxidation prior to implantation of impurities as a carrier supply thereinto. The SOI structure prevents the FET from being influenced by current leakage caused by a short channel. In addition, it is possible to significantly reduce a junction capacity between a drain and a substrate and a wiring capacity between a wiring layer and a substrate. Thus, gate delay time can be shortened, and the device can be operated at a higher speed. The oxide layer 13 as well as the amorphous silicon layer 33 prevents channeling. In addition, the amorphous silicon layer 33 and the oxide layer 13 cause the FET to be less influenced by charged particles such as alpha rays radiated from outside.

Figure 9:
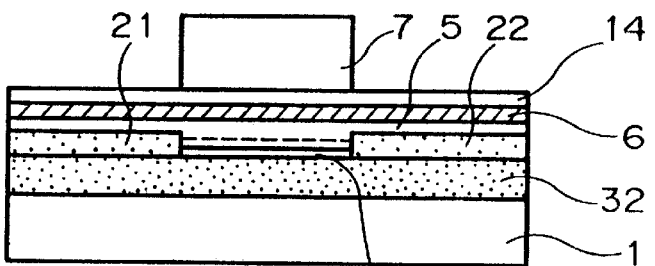
FIG. 9 is a cross-sectional view of a field effect transistor in accordance with the fifth embodiment of the present invention.

FIG. 9 illustrates a field effect transistor in accordance with the fifth embodiment. The illustrated FET includes a P$^-$ type substrate 1 made of single crystal silicon, an impurities-doped amorphous silicon hydride layer 32 formed in the silicon substrate 1 at a certain depth, N$^+$ source and drain regions 21 and 22 formed on the amorphous silicon hydride layer 32, a single crystal silicon layer 12 sandwiched between the source and drain regions 21 and 22 on the amorphous silicon hydride layer 32, and having a thickness smaller than those of the source and drain regions 21 and 22, a highly purified single crystal silicon layer 5 covering the single crystal silicon layer 12 and the source and drain regions 21 and 22 therewith, a gate insulating film 6 formed on the highly purified single crystal silicon layer 5, a silicon nitride film 14 formed over the gate insulating film 6, and a gate electrode 7 formed on the gate insulating film 6 above the single crystal silicon layer 12. The single crystal silicon layer 12 has an electron affinity greater than that of the amorphous silicon hydride layer 32. The amorphous silicon hydride layer 32 and the single crystal silicon layer 12 cooperate with each other to thereby form a potential well 8 at a junction therebetween.

The silicon nitride film 14 is formed just after the formation of the gate oxide film 6. By forming a film by means of plasma-enhanced CVD employing silane and ammonia, it is possible for the silicon nitride film 14 to have a more dense structure than that of an oxide film. Thus, it is possible to have a film into which humidity cannot easily to enter. The silicon film 14 prevents humidity contained in the amorphous silicon hydride layer 32 from scattering to atmosphere which scattering would be caused by thermal treatment of the layer 32. Thus, it is possible to keep the amorphous silicon hydride layer 32 in amorphous condition.

Figure 10:
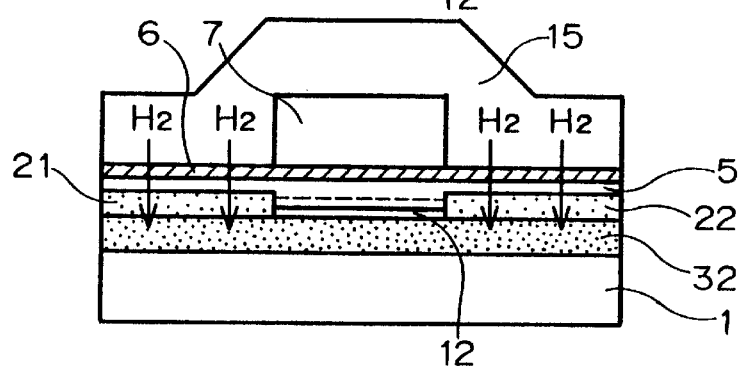
FIG. 10 is a cross-sectional view of a field effect transistor in accordance with the sixth embodiment of the present invention.

FIG. 10 illustrates a field effect transistor in accordance with the fifth embodiment. The illustrated FET has the same structure as that of the FET illustrated in FIG. 4, and further includes an interlayer insulating film 15 covering the gate electrode 7 and the gate oxide film 6 therewith. In the FET illustrated in FIG. 2 in accordance with the first embodiment, ion-implantation is carried out for turning the amorphous silicon layer 31 into the amorphous silicon hydride layer 32. However, as illustrated in FIG. 10, hydrogen contained in the interlayer insulating film 15 may be used for turning the amorphous silicon layer 31 into the amorphous silicon hydride layer 32. When an interlayer insulating film is made grown by plasma-enhanced CVD employing hydrogen and silane, a resultant film contains hydrogen therein. By heating the thus formed film at about 300° C., hydrogen contained therein is diffused out of the film, and then joins with dangling bonds in the amorphous silicon layer 31. Thus, the amorphous silicon layer 31 is turned into an amorphous silicon hydride layer 32.

The silicon nitride film 14 illustrated in FIG. 8A in accordance with the third embodiment also contains hydrogen therein, and thus the silicon nitride film 14 can turn the amorphous silicon film 31 into an amorphous silicon hydride layer 32.

Figure 11:
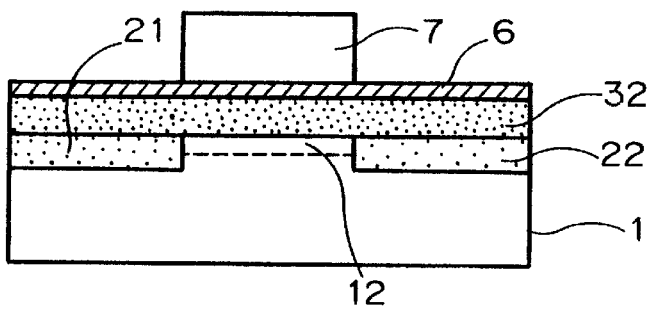
FIG. 11 is a cross-sectional view of a field effect transistor in accordance with the seventh embodiment of the present invention.

In all of the above mentioned first to sixth embodiments, a single crystal silicon layer is formed on an amorphous silicon hydride layer. Alternatively, an amorphous silicon hydride layer may be formed on a single crystal silicon layer. FIG. 11 illustrates a field effect transistor in accordance with the seventh embodiment which transistor has the above mentioned arrangement.

The illustrated FET includes a field effect transistor including (a) a silicon substrate 1, source and drain regions 21 and 22 formed in the silicon substrate 1, a semiconductor layer 12 made of single crystal silicon and sandwiched between the source and drain regions 21 and 22, an amorphous silicon hydride layer 32 formed on the source and drain regions 21 and 22 and the single crystal silicon layer 12, a gate oxide film 6 formed on the amorphous silicon hydride layer 32, and a gate electrode 7 formed on the gate insulating film 6. The amorphous silicon hydride layer 32 has an electron affinity smaller than that of the underlying single crystal silicon layer 12. The amorphous silicon hydride layer 32 and the single crystal silicon layer 12 cooperate with each other to form a potential well containing carriers.

The transistor illustrated in FIG. 11 is fabricated by making the implantation energy of dopant smaller than that of the first embodiment illustrated in FIG. 2, when the amorphous silicon layer 31 is formed.

The above mentioned first to seventh embodiments all relate to n-type MOS, however, it should be noted that the invention can be applied to a p-type MOS in which holes act as carriers. When the impurities-doped amorphous silicon layer 31 is to be formed, p-type impurities are employed for forming a p-type MOS.

The present invention having been described in connection with the preferred embodiments provides advantages as follows.

Firstly, the invention provides a HEMT utilizing a difference in electron affinity between a single crystal silicon layer and an amorphous silicon hydride layer. In a HEMT, since carriers are not influenced by scattering of dopant ions, it is possible to operate the HEMT at a higher speed.

Secondly, though it is quite difficult to form by epitaxial growth a structure in which a single crystal silicon layer is situated on an amorphous silicon, the invention makes it possible to form such a structure by ion-implantation and to operate a transistor having the structure in the same principle as that of a conventional MOS transistor. In addition, if a single crystal silicon layer is left on an amorphous silicon hydride layer, a highly purified silicon layer can be epitaxially grown. This ensures that a silicon layer having a smaller number of crystal defects and lower concentration of impurities can be used as a channel, and hence the mobility of carriers can be enhanced. Furthermore, since the above mentioned silicon layer is spaced away from a gate insulating film, it would be possible to prevent hot carriers from passing through the insulating film therethrough.

Thus, all of the above mentioned things contribute to higher speed operation of a transistor.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A field effect transistor comprising:
   (a) a first semiconductor layer made of amorphous silicon hydride;
   (b) a second semiconductor layer made of single crystal silicon having an electron affinity greater than that of said amorphous silicon hydride layer, in direct contact with said first semiconductor layer,
   said first and second semiconductor layers cooperating with each other to form at a junction therebetween a potential well which forms a channel in which carriers transfer; and
   (c) a single crystal layer formed on and in direct contact with said second semiconductor layer.

2. The field effect transistor as set forth in claim 1, wherein said first semiconductor layer is a layer containing impurities doped therein.

3. The field effect transistor as set forth in claim 1, wherein said potential well forms a channel for one of two-dimensional electron gas and two-dimensional source gas to transfer therethrough.

4. The field effect transistor as set forth in claim 1, wherein said second semiconductor layer contains an epitaxial silicon layer made of intrinsic semiconductor.

5. A field effect transistor comprising:
   (a) an amorphous semiconductor layer made of amorphous silicon hydride containing impurities doped therein;
   (b) a semiconductor layer made of single crystal silicon having an electron affinity greater than that of said amorphous silicon hydride, formed on and in direct contact with said amorphous semiconductor layer;
   (c) a gate insulating film formed on said semiconductor layer; and
   (d) a gate electrode formed on said gate insulating film,
   said amorphous semiconductor layer and said semiconductor layer cooperating with each other to thereby form a potential well at a junction therebetween.

6. The field effect transistor as set forth in claim 5, wherein said potential well forms a channel for one of two-dimensional electron gas and two-dimensional source gas to transfer therethrough.

7. The field effect transistor as set forth in claim 5, wherein said semiconductor layer contains an epitaxial silicon layer made of intrinsic semiconductor.

8. A field effect transistor comprising:
   (a) a first semiconductor layer made of single crystal silicon;
   (b) a second semiconductor layer made of amorphous silicon hydride containing impurities doped therein and having an electron affinity smaller than that of said single crystal silicon formed on and in direct contact with said first semiconductor layer;
   (c) a gate insulating film formed on said second semiconductor layer; and
   (d) a gate electrode formed on said gate insulating film,
   said first and second semiconductor layers cooperating with each other to form a potential well at a junction therebetween.

9. The field effect transistor as set forth in claim 8, wherein said potential well forms a channel for one of two-dimensional electron gas and two-dimensional source gas to transfer therethrough.

10. The field effect transistor as set forth in claim 8, wherein said second semiconductor layer contains an epitaxial silicon layer made of intrinsic semiconductor.

11. A field effect transistor comprising:
    (a) a semiconductor substrate having a first electrical conductivity;
    (b) an amorphous semiconductor layer formed in said semiconductor substrate and made of amorphous silicon hydride in which impurities having a second electrical conductivity are doped;

(c) source and drain regions formed on said amorphous semiconductor layer, said source and drain regions having a second electrical conductivity;

(d) a semiconductor layer made of single crystal silicon and sandwiched between said source and drain regions on said amorphous semiconductor layer, said single crystal silicon being formed on and in direct contact with said amorphous semiconductor layer, and having an electron affinity greater than that of said amorphous silicon hydride;

(e) a gate insulating film formed on said source and drain regions and said semiconductor layer; and (f) a gate electrode formed on said gate insulating film, said amorphous semiconductor layer and said semiconductor layer cooperating with each other to form a potential well at a junction therebetween which well contains carriers having a second electrical conductivity.

12. The field effect transistor as set forth in claim 11, wherein said semiconductor layer has a first portion sandwiched between said source and drain regions on said amorphous semiconductor layer, and a second portion covering said first portion and said source and drain regions therewith, said gate insulating film being formed on said second portion.

13. The field effect transistor as set forth in claim 12, wherein said second portion has higher purity than that of said first portion.

14. The field effect transistor as set forth in claim 12, further comprising a nitride film formed over said gate insulating film.

15. The field effect transistor as set forth in claim 12, further comprising an interlayer insulating film over said gate electrode and said gate insulating film, hydrogen contained in said interlayer insulating film being diffused into an amorphous semiconductor layer formed in said semiconductor substrate to thereby form said amorphous semiconductor layer made of amorphous silicon hydride in which impurities having a second electrical conductivity are doped.

16. The field effect transistor as set forth in claim 12, wherein said semiconductor layer contains an epitaxial silicon layer made of intrinsic semiconductor.

17. The field effect transistor as set forth in claim 12, further comprising a second amorphous semiconductor layer formed below said amorphous semiconductor layer.

18. The field effect transistor as set forth in claim 12, further comprising an oxide layer formed below said amorphous semiconductor layer.

19. A field effect transistor comprising:

(a) a silicon substrate having a first electrical conductivity;

(b) source and drain regions having a second electrical conductivity, formed in said silicon substrate;

(c) a semiconductor layer made of single crystal silicon and sandwiched between said source and drain regions;

(d) an amorphous semiconductor layer formed on said source and drain regions and said single crystal silicon semiconductor layer, and made of amorphous silicon hydride containing impurities having a second electrical conductivity doped therein, said amorphous semiconductor layer being formed on and in direct contact with said single crystal silicon semiconductor layer, and having an electron affinity smaller than that of said single crystal silicon semiconductor layer, said amorphous semiconductor layer and said single crystal silicon semiconductor layer cooperating with each other to form a potential well containing carriers having a second electrical conductivity;

(e) a gate insulating film formed on said amorphous semiconductor layer; and (f) a gate electrode formed on said gate insulating film.

20. The field effect transistor as set forth in claim 19, wherein said semiconductor layer contains an epitaxial silicon layer made of intrinsic semiconductor.

21. A field effect transistor comprising:

(a) a silicon substrate having a first electrical conductivity;

(b) an amorphous semiconductor layer made of amorphous silicon hydride containing impurities having a second electrical conductivity doped therein, and formed in said silicon substrate;

(c) source and drain regions having a second electrical conductivity, formed on said amorphous semiconductor layer;

(d) a semiconductor layer made of single crystal silicon and sandwiched between said source and drain regions on said amorphous semiconductor layer, said single crystal silicon semiconductor layer being formed on and in direct contact with said amorphous semiconductor layer, and having a smaller thickness than those of said source and drain regions;

(e) an epitaxial silicon layer made of intrinsic semiconductor and formed over said single crystal silicon semiconductor layer, both of said single crystal silicon semiconductor layer and said epitaxial silicon layer having an electron affinity greater than that of said amorphous silicon nitride;

(f) a gate insulating film formed on said epitaxial silicon layer; and (g) a gate electrode formed on said gate insulating film, said amorphous semiconductor layer and said single crystal silicon semiconductor layer cooperating with each other to form a potential well at a junction therebetween, which well contains carriers having a second electrical conductivity.

22. The field effect transistor as set forth in claim 21, further comprising a second amorphous semiconductor layer formed below said amorphous semiconductor layer.

23. The field effect transistor as set forth in claim 21, further comprising an oxide layer formed below said amorphous semiconductor layer.

* * * * *